(12) United States Patent
Beaulieu et al.

(10) Patent No.: US 12,247,890 B2
(45) Date of Patent: Mar. 11, 2025

(54) VACUUM GAUGE PROTECTOR FOR DEPOSITION SYSTEMS

(71) Applicant: Arradiance, LLC, Sudbury, MA (US)

(72) Inventors: David R. Beaulieu, Groton, MA (US); Jeffrey D. McHugh, Hudson, MA (US); Andrew Lushington, Somerville, MA (US)

(73) Assignee: Arradiance, LLC, Sudbury, MA (US)

( * ) Notice: Subject to any disclaimer, the term of this patent is extended or adjusted under 35 U.S.C. 154(b) by 490 days.

(21) Appl. No.: 17/015,310

(22) Filed: Sep. 9, 2020

(65) Prior Publication Data

US 2021/0088402 A1    Mar. 25, 2021

Related U.S. Application Data

(60) Provisional application No. 62/904,293, filed on Sep. 23, 2019.

(51) Int. Cl.
*G01L 19/06* (2006.01)
*C23C 16/44* (2006.01)
(Continued)

(52) U.S. Cl.
CPC ...... *G01L 19/0636* (2013.01); *C23C 16/4402* (2013.01); *C23C 16/45544* (2013.01); *G01L 19/0627* (2013.01); *G01L 21/00* (2013.01)

(58) Field of Classification Search
CPC . G01L 19/0636; G01L 21/00; C23C 16/4402; C23C 16/45544
(Continued)

(56) References Cited

U.S. PATENT DOCUMENTS

| 6,117,322 A * | 9/2000 | Miller | B01D 65/08 |
| | | | 210/489 |
| 7,300,873 B2 * | 11/2007 | Millward | C23C 16/308 |
| | | | 438/653 |

(Continued)

FOREIGN PATENT DOCUMENTS

| CN | 203247339 U | * 10/2013 |
| CN | 203929317 U | 11/2014 |

(Continued)

OTHER PUBLICATIONS

Translation CN-107726463-A (Year: 2013).*
Translation CN-203247339 (Year: 2013).*

*Primary Examiner* — Xin Y Zhong
*Assistant Examiner* — Monica S Young
(74) *Attorney, Agent, or Firm* — Rauschenbach Patent Law Group, PLLC; Kurt Rauschenbach (57) ABSTRACT

A vacuum gauge protector for deposition systems includes a body comprising an input port that is configured to couple to a vacuum chamber, and an output port configured to couple to a vacuum gauge. A deposition material filter is positioned in the body to present a tortuous path to gases comprising deposition materials entering the body where the surface area of the deposition material filter is greater than 2000 mm$^2$. In addition, the deposition material filter restricts deposition material from passing through the body to the output port so as to reduce vacuum gauge contamination while maintaining enough gas flow through the body to the output port so that the vacuum gauge response time can be less than 10 seconds.

19 Claims, 8 Drawing Sheets

(51) Int. Cl.
    *C23C 16/455*    (2006.01)
    *G01L 21/00*    (2006.01)
(58) Field of Classification Search
    USPC ............................................................ 73/706
    See application file for complete search history.

(56) References Cited

U.S. PATENT DOCUMENTS

| | | | | |
|---|---|---|---|---|
| 2003/0180458 A1* | 9/2003 | Sneh | ................ | H01L 21/68785 |
| | | | | 427/248.1 |
| 2004/0124131 A1* | 7/2004 | Aitchison | ........... | C23C 16/4402 |
| | | | | 210/252 |
| 2007/0120568 A1* | 5/2007 | Bjorkman | ............... | G01L 21/00 |
| | | | | 324/460 |
| 2018/0274093 A1* | 9/2018 | Takagi | .............. | C23C 16/45578 |

FOREIGN PATENT DOCUMENTS

| | | | | |
|---|---|---|---|---|
| CN | 107726463 A * | 2/2018 | ............. | F24F 13/32 |
| CN | 109742009 A | 5/2019 | | |
| EP | 161 352 B1 | 2/2014 | | |
| JP | 6812162 B2 * | 1/2021 | ............. | G01L 19/06 |
| KR | 10-0979576 | 9/2010 | | |
| WO | WO-9943410 A1 * | 9/1999 | ........... | B01D 29/055 |

\* cited by examiner

VACUUM GAUGE PROTECTOR FOR DEPOSITION SYSTEMS

CROSS REFERENCE TO RELATED APPLICATION

The present application is a non-provisional application of U.S. Provisional Patent Application No. 62/904,293 filed on Sep. 23, 2019, entitled "Device to Prevent Vacuum Gauge Contamination during Atomic Layer Deposition with Adequate Pulse Response". The entire contents of U.S. Provisional Patent Application No. 62/904,293 are herein incorporated by reference.

The section headings used herein are for organizational purposes only and should not to be construed as limiting the subject matter described in the present application in any way.

INTRODUCTION

Vacuum gauges are devices used to measure the pressure within a given volume. Vacuum gauges are often used in material deposition processing systems to monitor pressure so that certain pressures can be achieved before and during processing. Accurate measurements of pressure during the deposition processing are particularly critical for many thin film deposition processes. Vacuum gauges are often used to provide feedback to deposition system controllers that regulate gas flow and pumping conductance.

There are many types of vacuum gauges known in the art including thermocouple vacuum gauges, hot cathode ionization vacuum gauges, cold cathode ionization vacuum gauges, as well as capacitance vacuum gauges. These vacuum gauges can provide analog and digital outputs.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

DESCRIPTION OF VARIOUS EMBODIMENTS

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teaching can be performed in any order and/or simultaneously as long as the teaching remains operable. Furthermore, it should be understood that the apparatus and methods of the present teaching can include any number or all of the described embodiments as long as the teaching remains operable.

Vacuum gauges used to monitor pressure in vacuum deposition chambers during deposition processes are exposed to the deposition material which coat interior surfaces of the vacuum gauge. These deposition materials degrade performance of the vacuum gauge and eventually will render the vacuum gauge inoperative. As the performance of the vacuum gauge degrades, the deposition system loses its ability to monitor the deposition process resulting in process variations.

Deposition processes, such as atomic layer deposition, are particularly dependent on an accurate pressure reading during deposition. Atomic layer deposition is a thin film vapor phase deposition process that exposes the growth surface to alternating precursor gases that are introduced sequentially with essentially no overlap. Inaccurate pressure measurements will compromise the film growth and will skew estimations of precursor utilization.

Many current deposition process technologies are directional and, in such processes, the vacuum gauge can be positioned to reduce or prevent contamination and degradation. However, specialized systems and materials, which are dependent on the particular vacuum gauge, are often required to prevent contamination in these processes. In atomic layer deposition (ALD), precursor gasses are pulsed into a reaction chamber where pressure must be monitored to ensure the accurate dosage and growth of material. One challenge is that due to the nature of the ALD process, precursor gases are exposed to all portions of the chamber, including the pressure gauge, resulting in deposition within the internal components of the device. Such precursor gas exposure compromises the gauge's ability to accurately measure pressure.

Figure 1:
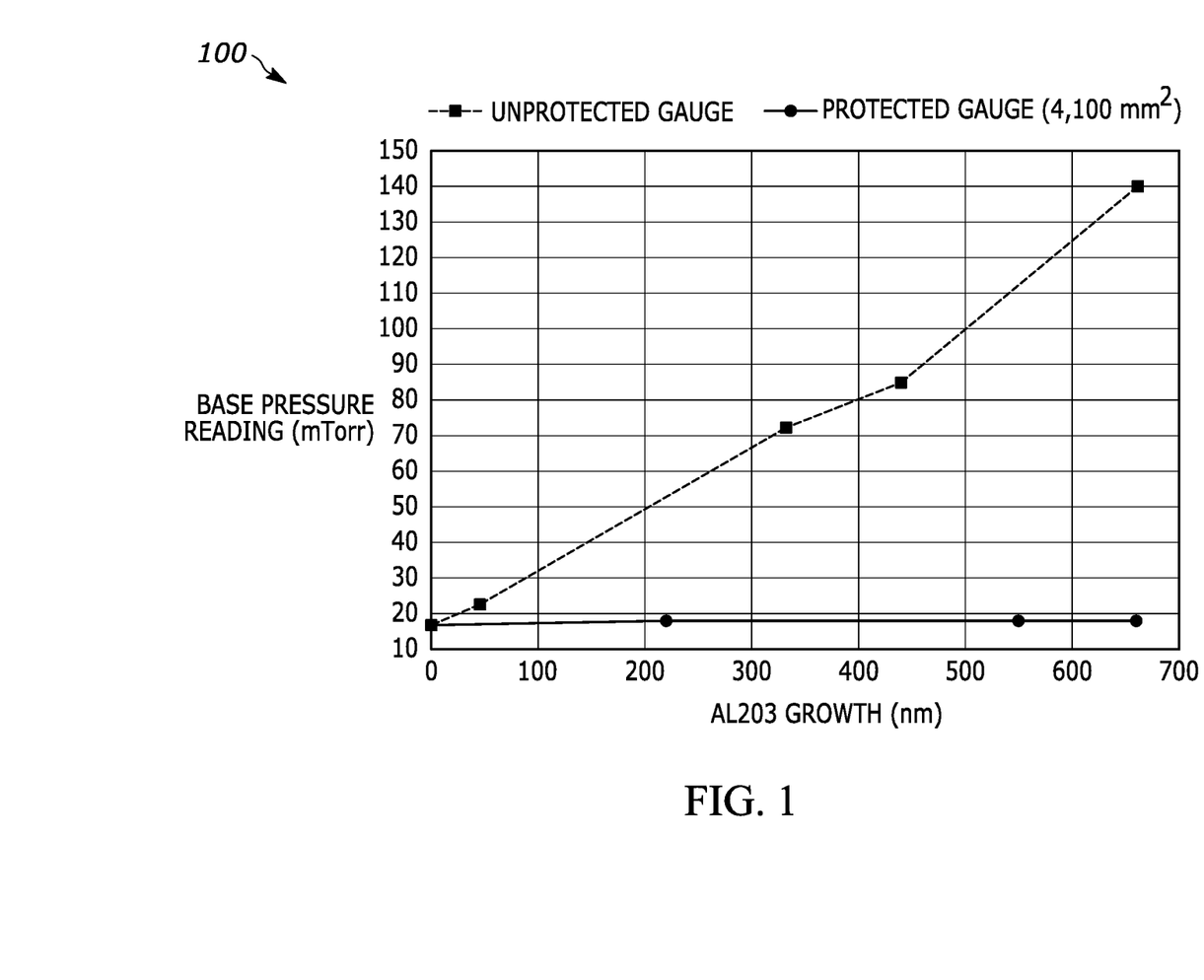
FIG. 1 illustrates a graph of base pressure data experimentally measured using both an unprotected vacuum gauge and a protected vacuum gauge as a function of experimentally measured aluminum oxide growth data.

To more clearly illustrate the problem of contamination and degradation of vacuum gauges in ALD processes, measured vacuum gauge performance data is presented for both an unprotected vacuum gauge and a protected vacuum gauge. FIG. 1 illustrates a graph 100 of base pressure data in mTorr experimentally measuring using both an unprotected vacuum gauge and a protected vacuum gauge as a function of measured aluminum oxide growth data in nanometers. The base pressure data presented was measured with a vacuum gauge protector that has an area of about 4,100 mm$^2$. These data clearly show that the protected vacuum gauge presents a stable base pressure measurement as the aluminum oxide film grows to nearly 700 nm. In contrast, these data show that the unprotected vacuum gauge degrades rapidly as the aluminum oxide film grows with a near linear relationship.

Thus, materials that deposit on input surfaces of a pressure gauge will universally damage the vacuum gauge's ability to present accurate and real-time measurements and will eventually (often rapidly) render the vacuum gauge inoperative. Devices according to the present teaching relate to a vacuum gauge protector for deposition systems that reduces the amount of deposition material that reaches the input of a vacuum gauge.

One aspect of the present teaching is to provide a universal device to reduce or prevent contamination of vacuum gauges without compromising adequate pressure pulse response during the deposition process that is needed for some deposition processes like ALD. More specifically, devices according to the present invention create a tortuous path in order to minimize the penetration of deposition materials that would deposit onto the vacuum gauge. Simultaneously, devices according to the present invention allow for adequate molecular flow of deposited material while still enabling the vacuum gauge to sense rapid pressure changes from precursor pulses used in ALD processes. In addition, devices according to the present invention can be easily replaced.

Figure 2:
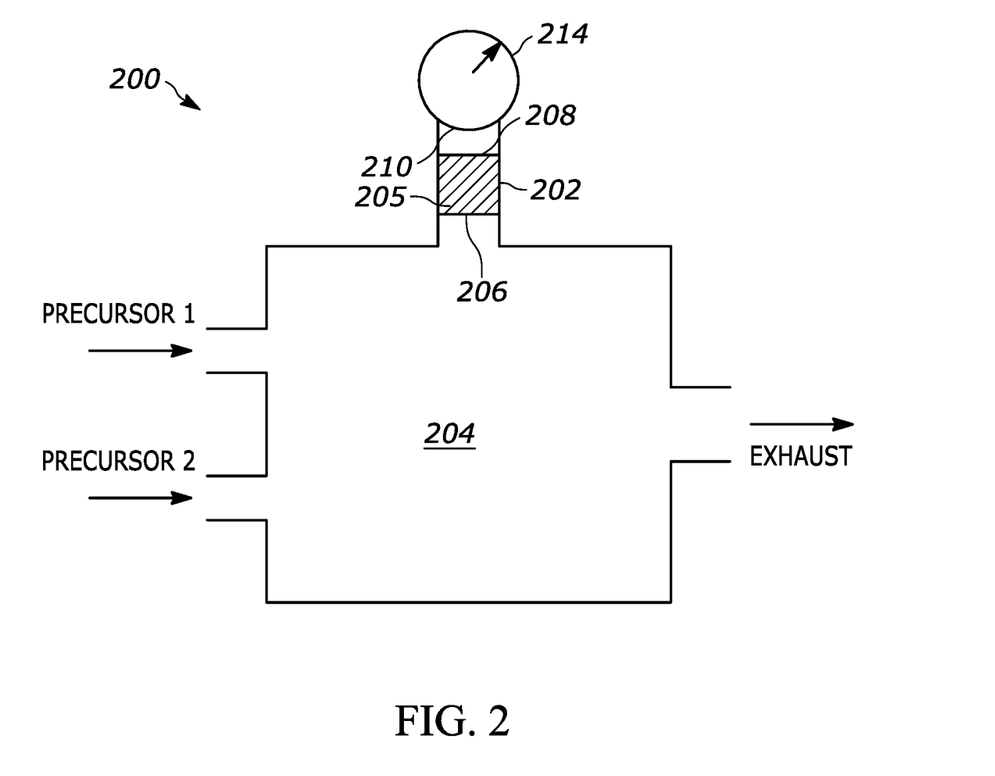
FIG. 2 illustrates a schematic diagram of a deposition system that uses a vacuum gauge protector according to the present teaching.

FIG. 2 illustrates a schematic diagram of a deposition system 200 that uses a vacuum gauge protector 202 according to the present teaching. The deposition system 200 includes a vacuum chamber 204 that can be a deposition chamber for atomic layer deposition in one specific embodiment, but it should be understood that the present teaching can be practiced with numerous types of deposition systems. The vacuum gauge protector 202 includes a body 205 having an input port 206 that is configured to couple to the vacuum chamber 204. In one embodiment, the body 205 is formed in the shape of a cylinder as described further herein. The vacuum gauge protector 202 of the present teaching can be used with any type of vacuum chamber 204. The body 205 also includes an output port 208 configured to couple to an input port 210 of a vacuum gauge 214 that is used to measure pressure of gas flowing from the input port 206 of the vacuum gauge protector 202 through the body 205 to the output port 208 of the body 205 and into the input port 210 of the vacuum gauge 214. The vacuum gauge protector 202 of the present teaching is generally independent of the type of vacuum gauge 214 that is coupled to the output port 208. That is, any type of vacuum gauge 214 can be coupled to the output port 208 of the body 205, such as a thermocouple vacuum gauge, hot cathode ionization vacuum gauge, cold cathode ionization vacuum gauge, and a capacitance vacuum gauge.

A deposition material filter is positioned in the body 205 of the vacuum gauge protector 202 that presents a tortuous path to gases comprising deposition materials that enter into the body 205. For embodiments where the body 205 is formed in the shape of a cylinder, the deposition material filter can be formed in a shape of a disk having an outer diameter dimensioned so that the deposition material filter fits into the cylindrical-shaped body tight enough so the gases comprising the deposition material are directed though the deposition material filter. In various configurations, centering rings can be used to align the deposition material filter in the body 205.

By "tortuous path", we mean that the path presents significant resistance to the gas flow with an increased probability that the deposition material is somehow prevented or at least significantly impeded from passing through the body 205. In many embodiments, a significant or even large fraction of the deposition material is trapped somewhere in the tortuous path and/or is mitigated in some way. For example, some deposition material filters are designed so that deposition material adheres or sticks to the deposition filter materials. In various embodiments, the deposition filter materials can be replaceable and/or can be regenerated in some way such as by applying heat. Also, some deposition material filters are formed of material and constructed so that they are non-corrosive.

The deposition material filter according to the present teaching presents a tortious path in many ways. For example, a tortuous path can be a non-linear path that increases the path length of deposition materials passing though the body. Some tortuous paths very significantly increase the path length presented to deposition material though the body in various ways. In some embodiments, the tortuous path is frequently changing in many directions. In some embodiments, there is a plurality of linear and/or non-linear paths created in order to create the desired surface area within the filter to create a tortuous path. Regardless of the embodiments, the tortuous path is presented to significantly increase the probability that deposition material with be somehow trapped and/or mitigated in the deposition material filter.

In one embodiment, the deposition material filter exposes gasses containing deposition materials passing though the deposition material filter to a surface area that is greater than 2000 mm$^2$. By surface area, we mean the combined surface area of the deposition material filter that the gas is exposed to while traversing the body. For example, if the deposition material filter comprises a plurality of disks, the combined surface area of the deposition material filter will be the combined surface areas of all of the plurality of disks. It has been experimentally determined that a deposition material filter which exposes gasses containing deposition materials to a surface area that is greater than 2000 mm$^2$ sufficiently restricts deposition material from passing through the body 205 to the output port 208 so as to reduce contamination of the vacuum gauge 214 and can also provide an adequate pulse response time to measure pressure changes relevant to ALD deposition. By "response time" we generally mean the time between the initial precursor pulse and resultant change in pressure gauge reading.

There are many possible physical embodiments of the deposition material filter according to the present teaching. The deposition material filter can be one single filter formed of a single piece of material or can be formed of a plurality of identical or different filters. Many embodiments of the deposition material filter formed of a plurality of filters typically are configured so that a sum of the area of each of the plurality of deposition material filters is greater than 2000 mm$^2$. For example, the deposition material filter can be a plurality of disks as described further below that form the tortuous path for gases comprising the deposition material where the sum of the area of each of the plurality of disks is greater than 2000 mm$^2$.

In one embodiment, the deposition material filters are formed of metal. In one specific embodiment, the deposition material filter is formed of a metal mesh. Other deposition material filters according to the present teaching are formed of glass. In one specific embodiment, the deposition material filter is formed of a glass capillary array comprising a plurality of apertures that traverse vertically through a cross-section of the deposition material filter. Other deposition material filters are formed of a ceramic material. In many embodiments, the disks are formed of materials that are non-corrosive material and/or formed of materials that promotes condensation as described herein.

As the combined surface area of the deposition material filter that the gas is exposed to while traversing the body 205 increases, an increasing amount of deposition material is prevented from reaching the output port 208 of the body 205 and thus the input port 210 to the vacuum gauge 214, which further protects the vacuum gauge 214 extending its operational lifetime. However, as this combined surface area increases, the response time of the vacuum gauge 214 also increases. Eventually, as the surface area continues to increase, the response time of the vacuum gauge 214 is so long that it cannot be used to monitor the pressure of deposition processes with changing gas flows like atomic layer deposition.

One aspect of the present teaching is that it has been experimentally determined that a surface area of about 2000 mm$^2$ will still maintain enough gas flow through the body 205 of the deposition material filter of the vacuum gauge protector 202 to the output port 208 so that the response time of the vacuum gauge 214 can be less than 10 seconds. For many processes, it is important to have a response time that is less than 10 seconds to properly monitor and measure pressure changes resulting from gases being rapidly injected into the vacuum chamber 204 during a deposition process such as atomic layer deposition and molecular layer deposition. It has been determined experimentally that the surface area of the deposition material filter exposed to the process gasses can be selected for a particular pressure pulse response of a particular type of vacuum gauge coupled to the output port 208 of the body 205. It is desirable for some processes to have the deposition material filter be constructed and configured so that the gas flow through the body 205 to the output port 208 and into the input port 210 of the vacuum gauge 214 is accomplished so that the vacuum gauge 214 response time is less than a time required to deliver and subsequently purge a pulse of gas comprising the deposition material into the vacuum chamber 204.

A method of reducing contamination of a vacuum gauge coupled to a vacuum chamber during deposition according to the present teaching includes coupling an input port of a body to a vacuum chamber where the body comprises an output port configured to couple to a vacuum gauge that measures pressure in the vacuum chamber. Gases comprising deposition material that enter from the input port of the body are restricted from passing through the output port to the vacuum gauge by presenting a tortuous path to the gases comprising deposition material. In various methods, the tortuous path can be a non-linear path that increases the path length of deposition materials passing though the body sometimes frequently changing in many directions. Also, in various methods, the tortuous path significantly increases the probability that deposition material will be somehow trapped and/or mitigated in the deposition material filter.

Simultaneously, the presentation of the tortuous path to the gases comprising deposition material provides enough flow of gases comprising the deposition material to the vacuum gauge so that the vacuum gauge response time can be less than a predetermined time required to pulse and adequately purge a precursor gas, such as a pulse of precursor gases in an atomic layer deposition process that is introduced into the vacuum chamber. In one specific embodiment, the required time between initial gas pulse and pressure gauge response is less than 10 seconds.

As described in more detail below, various configurations of different disks can be used to construct a cylindrical deposition material filter. The disks can be formed of numerous types of materials including metals. For example, some embodiments use at least one bottleneck disk that concentrates a flow of deposition material into a single region. These bottleneck disks can include a disk with a centrally located aperture. Also, some embodiments use at least one spacer disk that forces the flow of deposition material outward, thereby dissipating the gas comprising the deposition material. These spacer disks can include a plurality of prongs having a triangular profile. In addition, some embodiments use at least one spreader disk comprising a plurality of apertures. The spreader disk can include a plurality of apertures arranged in a circular pattern.

In one particular embodiment, the deposition material filter comprises a plurality of disks including a disk stack that comprises at least one bottleneck disk, at least one spacer disk, and at least one spreader disk. The disk stack comprising a plurality of bottleneck disks, a plurality of spacer disks, and a plurality of spreader disks can be arranged sequentially. For example, the disk stack can include a first bottleneck disk positioned proximate to the input port, a spacer disk positioned adjacent to and downstream of the first bottleneck disk, a spreader disk positioned adjacent and downstream of the spacer disk, and a second bottleneck disk positioned adjacent to and downstream of the spreader disk. Some filters according to the present teaching can include a plurality of disk stacks positioned sequentially.

Figure 3:
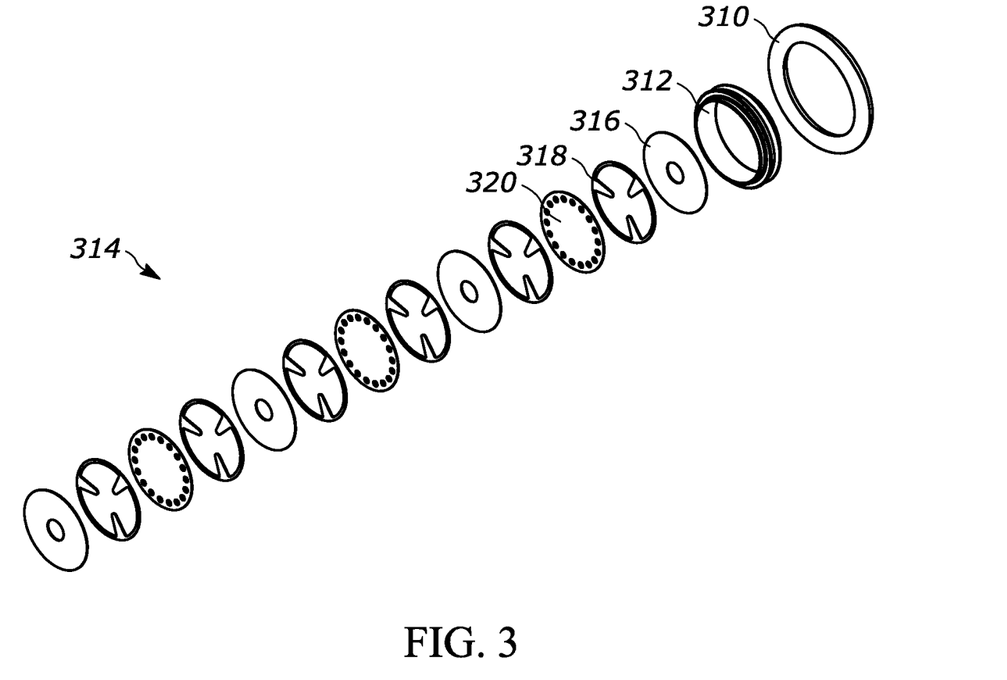
FIG. 3 illustrates an exploded view of a deposition material filter for a vacuum gauge protector according to one embodiment of the present teaching that comprises a plurality of disks.

FIG. 3 illustrates an exploded view of deposition material filter 300 for a vacuum gauge protector according to one embodiment of the present teaching that comprises a plurality of disks. The filter 300 includes an O-ring 310, a standard KF-type centering ring 312, and a disk stack 314 comprising a plurality of disks. The disk stack 314 shown in FIG. 3 includes a plurality of disks that include four bottleneck disks 316, six spacer disks 318, and three spreader disks 320, which are sequentially arranged in the pattern shown in FIG. 3. The O-ring 310 is attached to the outer rim of a KF centering ring 312 which acts as a gasket and provides an appropriate vacuum seal. The disk stack 314 is introduced into the KF centering ring 312 to direct precursor flow through a tortuous path to minimize the amount of material that can reach the sensitive internal components of a vacuum gauge. The KF centering ring 312 and the disk stack 314 can be constructed of a non-corrosive material that can also have surface properties which promote precursor condensation or deposition.

The O-ring 310 comprises a round ring body and provides a method of vacuum sealing to prevent gas from entering the surrounding environment. The O-ring 310 may be manufactured of a material that does not degrade in the presence of the precursor gasses or high temperature while maintaining its flexibility and ability to create the require seal.

The disk stack 314 comprises a central axis, a plurality of bottleneck disks 316, a plurality of spacer disks 318, and a plurality of spreader disks 320, as described in more detail below. The central axis of the disk stack 314 is orthogonally and centrally positioned relative to the disk stack 314. The central axis acts as a midpoint which allows a more accurate description of the assembly of the components.

In the embodiment shown in FIG. 3, the disk stack 314 is arranged in the following order: (1) bottleneck disk 316; (2) a spacer disk 318; (3) spreader disk 320; (4) another spacer disk 318; and finally (5) another bottleneck disk 316 that completes the pattern. This pattern can then be repeated until the disk stack 314 is comprised of a desired number of disks. However, it is understood that the optimal number of disks depends on several factors such as the area of each of the disks, the desired gauge protection, and the desired pressure pulse response. Devices according to the present teaching have been constructed for ALD and it has been determined experimentally that thirteen disks with a total surface area of all the disks equal to between 2000 mm$^2$ and 17,000 mm$^2$ results in good performance metrics. However, larger total surface areas can also be used with gradually higher response times.

Figure 4:
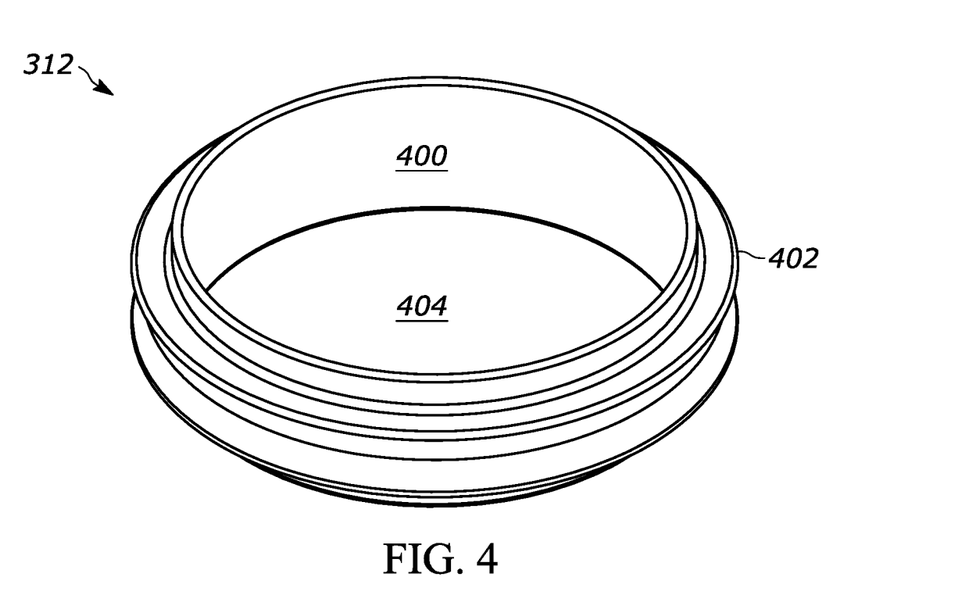
FIG. 4 illustrates a perspective view of a KF centering ring for a vacuum gauge protector according to one embodiment of the present teaching that comprises a plurality of disks.

FIG. 4 illustrates a perspective view of the KF centering ring 312 described in connection with FIG. 3. The KF centering ring 312 is comprised of a cylindrical body 400 and an outer rim 402. The cylindrical body 400 of the KF centering ring 312 comprises an aperture 404 that traverses the entire height of the standard KF centering ring 312. This allows the disk stack 314 to be introduced into the KF centering ring 312. In one embodiment, an industry standard KF centering ring is used. However, in various alternate embodiments, the geometry of the cylindrical aperture traversing the entire height of the KF centering ring 312 may be elongated or otherwise modified to fit multiple disk stacks 314 in order to best achieve a balance of gauge protection and pressure pulse response. The outer rim 402 of the KF centering ring 312 comprises an annular ring body with an inner diameter that is the same as the outer diameter of the disk stack 314. The outer rim 402 of the KF centering ring 312 contains a recess with a profile identical to that of the O-ring 310, so that the O-ring 310 may be introduced into the recess.

Figure 5:
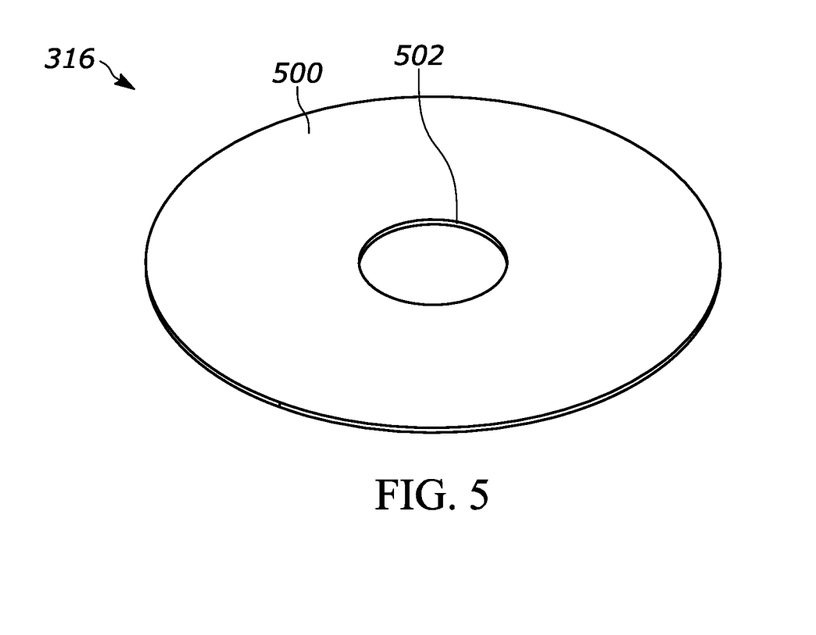
FIG. 5 illustrates a perspective view of a bottleneck disk for a vacuum gauge protector according to one embodiment of the present teaching that comprises a plurality of disks.

FIG. 5 illustrates a perspective view of a bottleneck 316 disk for a vacuum gauge protector according to one embodiment of the present teaching that comprises a plurality of disks. The bottleneck disk 316 is comprised of an annular ring 500 with an outer diameter similar to the inner diameter of the KF centering ring 312. The bottleneck disk 316 is comprised of a disk with a central hole 502. The bottleneck disk 316 centers the flow of precursor gas into the central hole 502 and "bottlenecks" the flow of deposition material through the disk stack 314 and into the cavity formed by the spacer disks 318.

Figure 6:
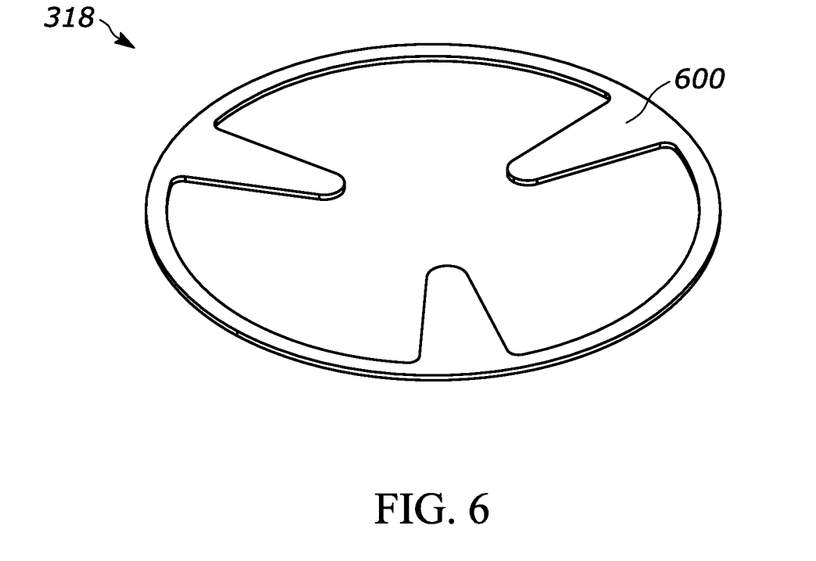
FIG. 6 illustrates a perspective view of a spacer disk for a vacuum gauge protector according to one embodiment of the present teaching that comprises a plurality of disks.

FIG. 6 illustrates a perspective view of a spacer disk 318 for a vacuum gauge protector according to one embodiment of the present teaching that comprises a plurality of disks. The spacer disk 318 allows the precursor to dissipate the flow introduced from the bottleneck disk 316. The spacer disk 318 is comprised of a ring with a plurality of prongs 600. The outer diameter of the spacer disk 318 is similar diameter to the inner diameter of the KF centering ring 312. In one specific embodiment, the spacer disk 318 includes a plurality of prongs 600 formed in a radial distribution where each the plurality of prongs 600 comprises a triangular-shaped profile. A corner of each of the members of the plurality of prongs 600 is oriented towards the central axis.

Figure 7:
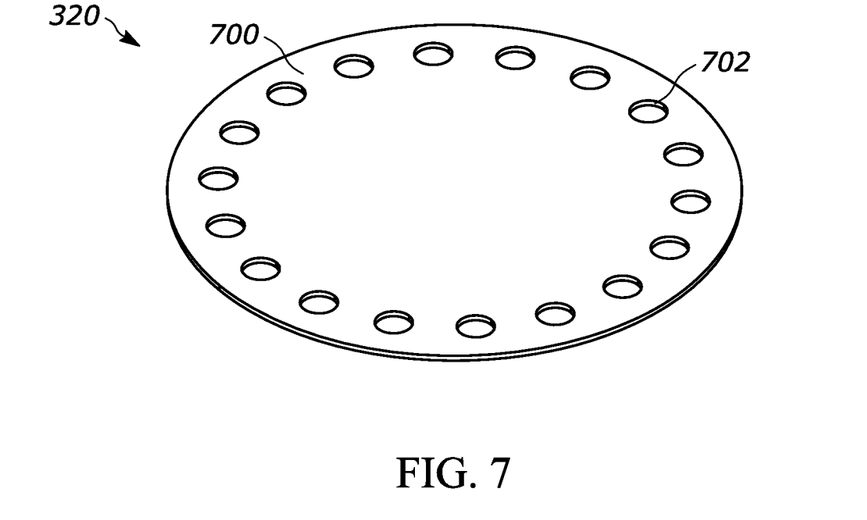
FIG. 7 illustrates a perspective view of a spreader disk for a vacuum gauge protector according to one embodiment of the present teaching that comprises a plurality of disks.

FIG. 7 illustrates a perspective view of a spreader disk 320 for a vacuum gauge protector according to one embodiment of the present teaching that comprises a plurality of disks. The spreader disk 320 is a circular disk 700 with an outer diameter similar to the inner diameter of the KF centering ring 312. The spreader disk 320 comprises a plurality of apertures 702 arranged in a circular pattern concentric to the spreader disk 320 that traverse the entire height of the spreader disk 320. The plurality of apertures 702 is positioned near the outer diameter of the spreader disk 320.

Figure 8:
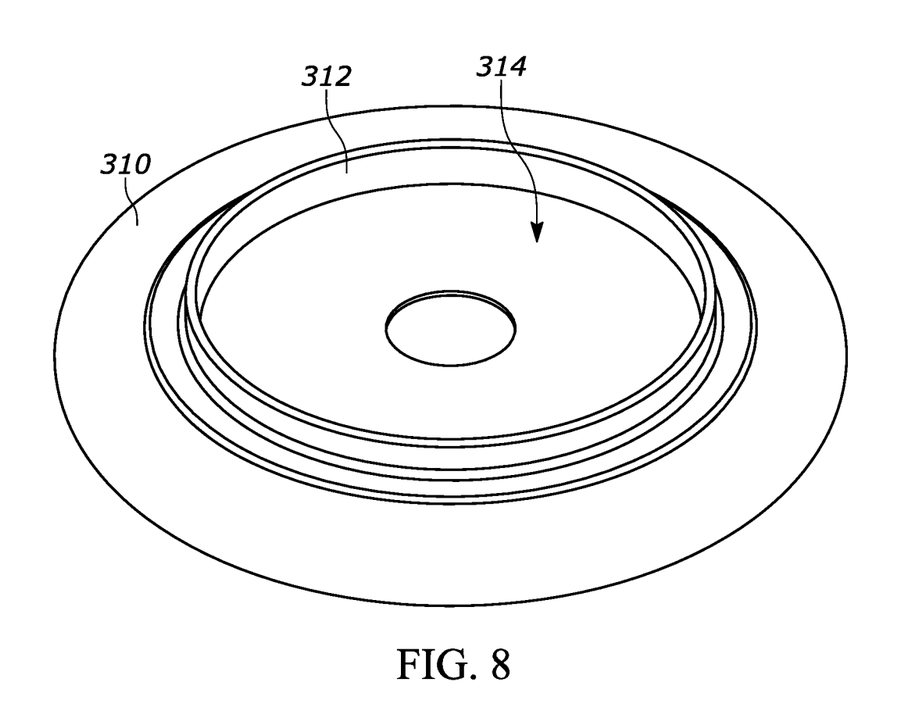
FIG. 8 illustrates a perspective top view of an assembled vacuum gauge protector according to one embodiment of the present teaching that comprises a plurality of disks.

FIG. 8 illustrates a perspective top view of an assembled vacuum gauge protector according to one embodiment of the present teaching that comprises a plurality of disks. In the embodiment shown, the O-ring 310 is introduced into the recess of the outer rim of the KF centering ring 312 and the disk stack 314 is introduced concentrically into the KF centering ring 312. The KF centering ring 312 and the O-ring 310 are constructed to universally fit into industry standard vacuum systems.

In operation, as the precursor gas flows through the disk stack 314, the gas first passes through the bottleneck disk 316 which concentrates the flow into a single area. The spacer disk 318 then forces the flow of gas outward toward the plurality of apertures in the spreader disk 320. The precursor gas then condenses within the following spacer disk 318 and finally exits through the subsequent bottleneck disk 316.

Figure 9:
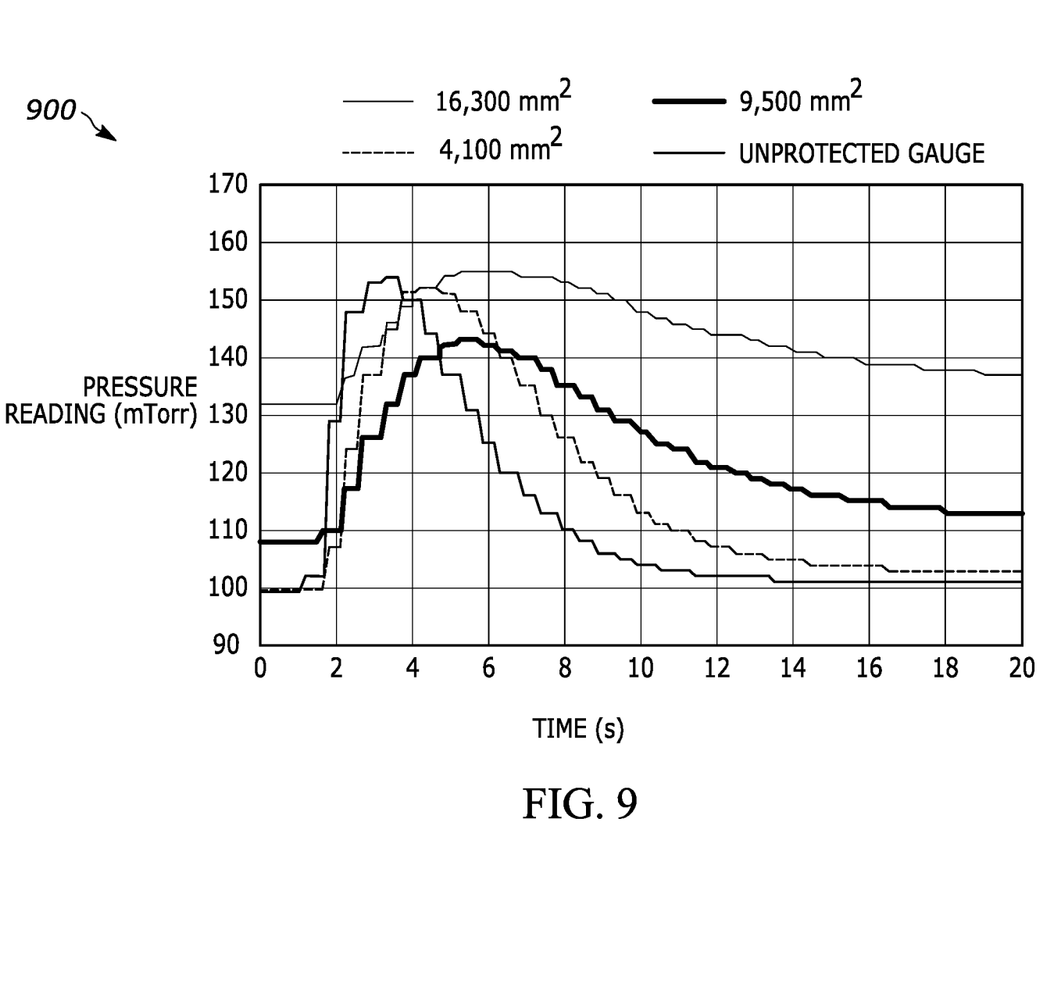
FIG. 9 illustrates a graph of experimentally measured pressure response data in mTorr of a vacuum gauge protected with the vacuum gauge protector described in connection with FIG. 3 as a function of time for various tortuous path surface areas.

FIG. 9 illustrates a graph 900 of experimentally measured pressure response data in mTorr of a vacuum gauge protected with the vacuum gauge protector described in connection with FIG. 3 as a function of time for various tortuous path surface areas.

The graph 900 shows that for an unprotected gauge, the pressure response is desirable in that, the unprotected gauge presents the most accurate pressure readings over a 20 second period. The graph 900 also shows that when the vacuum gauge protector according to the present teaching is used with a 16,300 mm$^2$ total surface area, the pressure gauge's response time is greatly lengthened, but still acceptable for many processes. As the tortuous path surface areas increases, the protection of the vacuum gauge also increases but so does the time required for the gauge to respond to pressure change.

Figure 10:
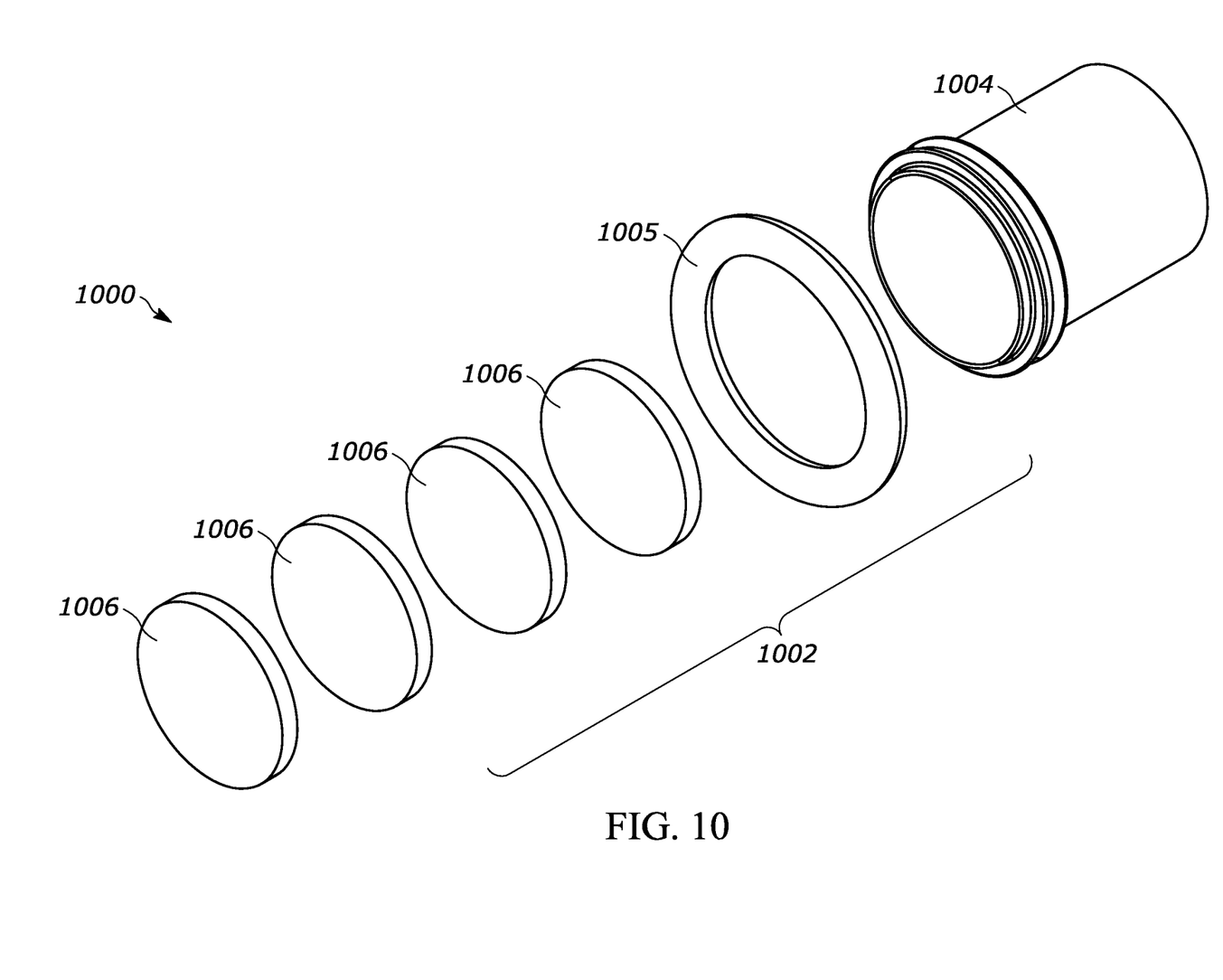
FIG. 10 illustrates an exploded view of another embodiment of a deposition material filter for a vacuum gauge protector according to one embodiment of the present teaching that comprises a plurality of disks.

FIG. 10 illustrates an exploded view of another embodiment of a deposition material filter for a vacuum gauge protector 1000 according to one embodiment of the present teaching that comprises a plurality of disks 1002. In this alternate embodiment of the vacuum gauge protector 1000 of the present teaching, the KF centering ring 1004 is a hollow cylindrical member which comprises an outer rim and a recess where an O-ring may be introduced. In this alternate embodiment, the KF centering ring 1004 is elongated where one end of the centering ring 1004 is delineated by a similarly circular device with a hole positioned concentric with the KF centering ring 1004, thereby forming an elongated cylindrical recess. The opposite end of the delineated KF centering ring 1004 comprises the outer rim, the recess, and the O-ring 1005. This cylindrical member of the alternate embodiment of the KF centering ring 1004 allows for a plurality of components to be introduced into the KF centering ring 1004 and is not limited to any particular component or combination of components.

For example, the KF centering ring 1004 may be used with one or a plurality of glass capillary disks 1006. The glass capillary disk 1006 comprises a cylindrical piece in which a plurality of apertures traverses through the height of the disk. Another example is that KF centering ring 1004 may be used with a metal mesh such as steel wool that may be introduced into the ring system. Additionally, a 3D printed metal cylinder, which comprises a plurality of tortuous paths of custom design that traverse through the entire height or a portion of the height of the 3D printed metal cylinder may be used. The glass capillary disk, steel wool, and 3D printed metal cylinder provide alternative methods for reducing vacuum gauge contamination and enhancing the longevity of pressure sensing devices, thereby decreasing the chances of vacuum gauge contamination.

For example, in this alternate embodiment, the disk stack 1002 or a plurality of disk stacks may be introduced into the KF centering ring 1004 along with the glass capillary disk, steel wool, and/or 3D printed metal cylinder. A plurality of different components may be introduced into the KF centering ring 1004 to best prevent vacuum gauge contamination as well as achieve an appropriate pulse response.

Figure 11:
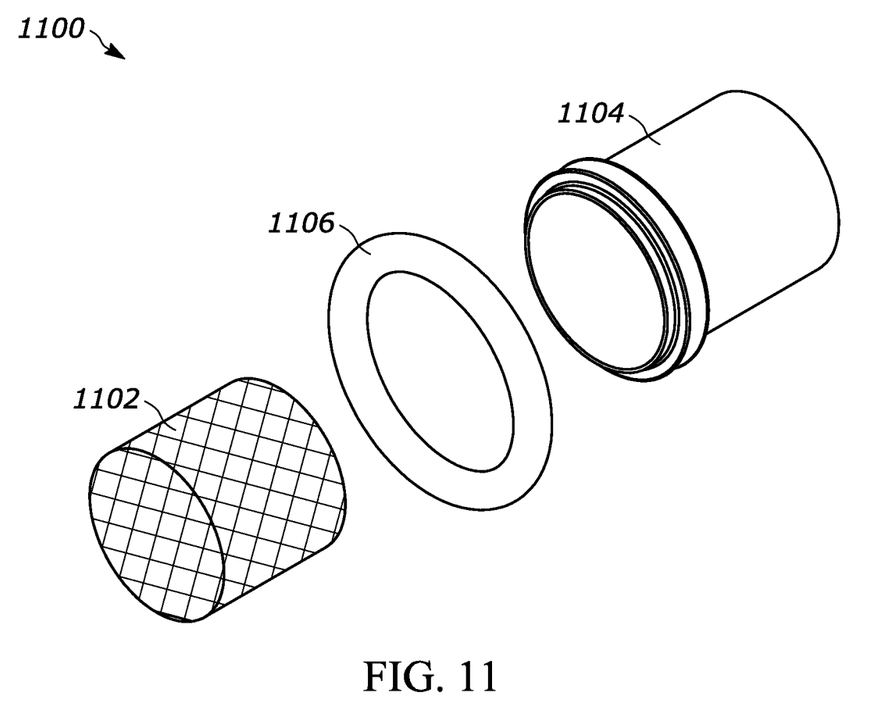
FIG. 11 illustrates an exploded view of another embodiment of a deposition material filter for a vacuum gauge protector according to one embodiment of the present teaching that comprises a single cylindrical disk.

FIG. 11 illustrates an exploded view of another embodiment of a deposition material filter for a vacuum gauge protector 1100 according to one embodiment of the present teaching that comprises a single cylindrical disk 1102. In this alternate embodiment of the vacuum gauge protector 1100 of the present teaching, the KF centering ring 1104 is also a hollow cylindrical member which comprises an outer rim and a recess where an O-ring 1106 may be introduced. The KF centering ring 1104 is elongated where one end of the centering ring 1104 is delineated by a similarly circular device with an aperture positioned concentric with the KF centering ring 1104, thereby forming an elongated cylindrical recess. The opposite end of the delineated KF centering ring 1104 comprises the outer rim, the recess, and the O-ring 1106. This cylindrical member of the alternate embodiment of the KF centering ring 1104 allows for the single cylindrical disk 1102 to be introduced into the KF centering ring 1104 and is not limited to any particular component or combination of components.

For example, the single cylindrical disk 1102 may be a metal mesh, such as steel wool that may be introduced into the KF centering ring 1104. Additionally, a 3D printed metal cylinder, which comprises a plurality of tortuous paths of custom design that traverse through the entire height or a portion of the height of the 3D printed metal cylinder may be used. The steel wool and 3D printed metal cylinder provide alternative methods for reducing vacuum gauge contamination and enhancing the longevity of pressure sensing devices, thereby decreasing the chances of vacuum gauge contamination.

EQUIVALENTS

While the applicant's teaching is described in conjunction with various embodiments, it is not intended that the applicant's teaching be limited to such embodiments. On the contrary, the applicant's teaching encompass various alternatives, modifications, and equivalents, as will be appreciated by those of skill in the art, which may be made therein without departing from the spirit and scope of the teaching.

The invention claimed is:

1. A vacuum gauge protector for a vacuum gauge configured to couple to a port of a deposition system, the vacuum gauge protector comprising:
   a) a body comprising an input port configured to couple to the vacuum gauge; and
   b) a deposition material filter positioned in the body and comprising an inlet, at least three stacked disks, and an outlet, wherein the three stacked disks are configured to provide a plurality of non-linear paths to gases entering into the deposition material filter, wherein a first disk of the at least three stacked discs has only a single centered aperture, the first disc fluidly connected to a second disc of the at least three discs having a plurality of apertures adjacent to a disc circumference, wherein the third disc of the at least three stacked discs has only a single centered aperture, wherein the gases flow from the first disc to the second disc to the third disc to provide a path of resistance to limit gases comprising deposition material from reaching the vacuum gauge so as to reduce contamination of the vacuum gauge.

2. The vacuum gauge protector of claim 1 wherein the body is formed in a cylindrical shape.

3. The vacuum gauge protector of claim 2 wherein the deposition material filter is formed in a shape of a disk having an outer diameter so that the deposition material filter fits into the cylindrical-shaped body tight enough so the gases comprising the deposition material are directed though the deposition material filter.

4. The vacuum gauge protector of claim 1 wherein at least some of the plurality of disks comprise metal disks.

5. The vacuum gauge protector of claim 1 wherein at least some of the plurality of disks are formed of a non-corrosive material.

6. The vacuum gauge protector of claim 1 wherein the body comprises a centering ring.

7. The vacuum gauge protector of claim 1 wherein the deposition material filter comprises a metal.

8. The vacuum gauge protector of claim 7 wherein the metal comprises a metal mesh.

9. The vacuum gauge protector of claim 1 wherein the deposition material filter is formed of a glass.

10. The vacuum gauge protector of claim 9 wherein the deposition material filter comprises a glass capillary array comprising a plurality of apertures that traverse vertically through a cross-section of the deposition material filter.

11. The vacuum gauge protector of claim 1 wherein the deposition material filter is formed of a ceramic.

12. The vacuum gauge protector of claim 1 wherein the deposition material filter comprises a plurality of deposition material filters.

13. The vacuum gauge protector of claim 1 wherein a surface area of the deposition material filter is chosen for a particular pressure pulse response of the vacuum gauge coupled to the output port of the body.

14. The vacuum gauge protector of claim 1 wherein the deposition material filter is configured so that a response time of the vacuum gauge can be less than a time required to deliver and adequately purge a pulse of a gas comprising the deposition materials.

15. The vacuum gauge protector of claim 1 wherein the plurality of disks comprises four disks.

16. The vacuum gauge protector of claim 1 wherein the plurality of non-linear paths comprises four paths.

17. A method of reducing contamination of a vacuum gauge coupled to a vacuum chamber during deposition, the method comprising:
   a) coupling an input port of a body to a vacuum chamber, the body comprising an output port configured to couple to the vacuum gauge that measures pressure in the vacuum chamber; and
   b) restricting gases comprising deposition material that enter from the input port of the body from passing through the output port to the vacuum gauge by directing gases comprising deposition materials through a plurality of non-linear paths to direct gases entering the body to a first filter disc with only a single centered aperture, then to a second disc having a plurality of apertures adjacent to a disc circumference of the second disc, and then to a third disc with only a single centered aperture, wherein the first second, and third discs provide reduced contamination of the vacuum gauge.

18. The method of claim 17 wherein gases comprising deposition material are precursor gases introduced for deposition.

19. The method of claim 17 wherein the plurality of non-linear paths comprises four non-linear paths.

\* \* \* \* \*